United States Patent [19]

Wentland, Jr. et al.

[11] Patent Number: 5,461,541

[45] Date of Patent: Oct. 24, 1995

[54] ENCLOSURE FOR AN ELECTRONIC CIRCUIT MODULE

[75] Inventors: William A. Wentland, Jr., Bristol; Alan M. Hansen, Higganum; Ramon W. Rosati, Simsbury, all of Conn.

[73] Assignee: Dana Corporation, Toledo, Ohio

[21] Appl. No.: 200,071

[22] Filed: Feb. 22, 1994

[51] Int. Cl.[6] ........................................ H05K 7/20
[52] U.S. Cl. .................. 361/707; 24/570; 248/316.7; 257/726; 361/719; 361/809; 411/522
[58] Field of Search ............. 248/316.7; 174/16.3; 267/160, 164; 165/80.3, 185, 80.1, 80.2; 403/372; 411/516, 520, 522; 24/295, 457, 458, 530, 531, 568, 570; 257/707, 709, 713, 718, 719, 726, 727; 361/704–707, 713–719, 807, 809, 811

[56] References Cited

U.S. PATENT DOCUMENTS

| | | | |
|---|---|---|---|
| 3,995,141 | 11/1976 | Vieau | 219/386 |
| 4,716,498 | 12/1987 | Ellis . | |
| 4,918,571 | 4/1990 | Grabbe . | |
| 4,923,179 | 5/1990 | Mikolajczak . | |
| 5,060,112 | 10/1991 | Cocconi . | |
| 5,075,822 | 12/1991 | Baumler et al. . | |
| 5,109,318 | 4/1992 | Funari et al. . | |
| 5,161,087 | 11/1992 | Frankeny et al. . | |
| 5,168,348 | 12/1992 | Chu | 257/713 |
| 5,225,965 | 7/1993 | Bailey | 361/386 |
| 5,243,131 | 9/1993 | Jakob et al. . | |
| 5,268,814 | 12/1993 | Yakubowski . | |
| 5,274,193 | 12/1993 | Bailey | 174/16.3 |
| 5,327,324 | 7/1994 | Roth | 361/707 |
| 5,343,362 | 8/1994 | Solberg | 361/710 |
| 5,344,113 | 9/1994 | Jurek | 248/316.7 |

OTHER PUBLICATIONS

Superior Electric Company Drawing No. 220704, dated Feb. 27, 1992.

*Primary Examiner*—Gerald P. Tolin
*Attorney, Agent, or Firm*—MacMillan, Sobanski & Todd

[57] ABSTRACT

An enclosure for protectively housing a printed circuit board in an electronic circuit module includes a base having an internal surface and an external surface. The base includes a pair of raised mounting pads formed on the internal surface which define respective mounting surfaces. A pair of channels are also formed on the internal surface of the base. The enclosure further includes a cover having a panel portion and a pair of end wall portions. Respective projections are formed on each of the end wall portions which define grooves therein. The cover is assembled to the base by inserting the edges of the end wall portions provided on the cover into the channels provided on the base. A plurality of spring clips is disposed within each of the grooves provided on the cover. The spring clips can be positioned at any desired location along each of the grooves. When the cover is connected to the base, the spring clips urge electrical components mounted on the printed circuit board into abutment with the mounting pads provided on the base. As a result, a firm mechanical engagement is maintained between the electrical components and the mounting pads. The mounting pads conduct heat generated by electrical components away therefrom for dissipation.

19 Claims, 2 Drawing Sheets

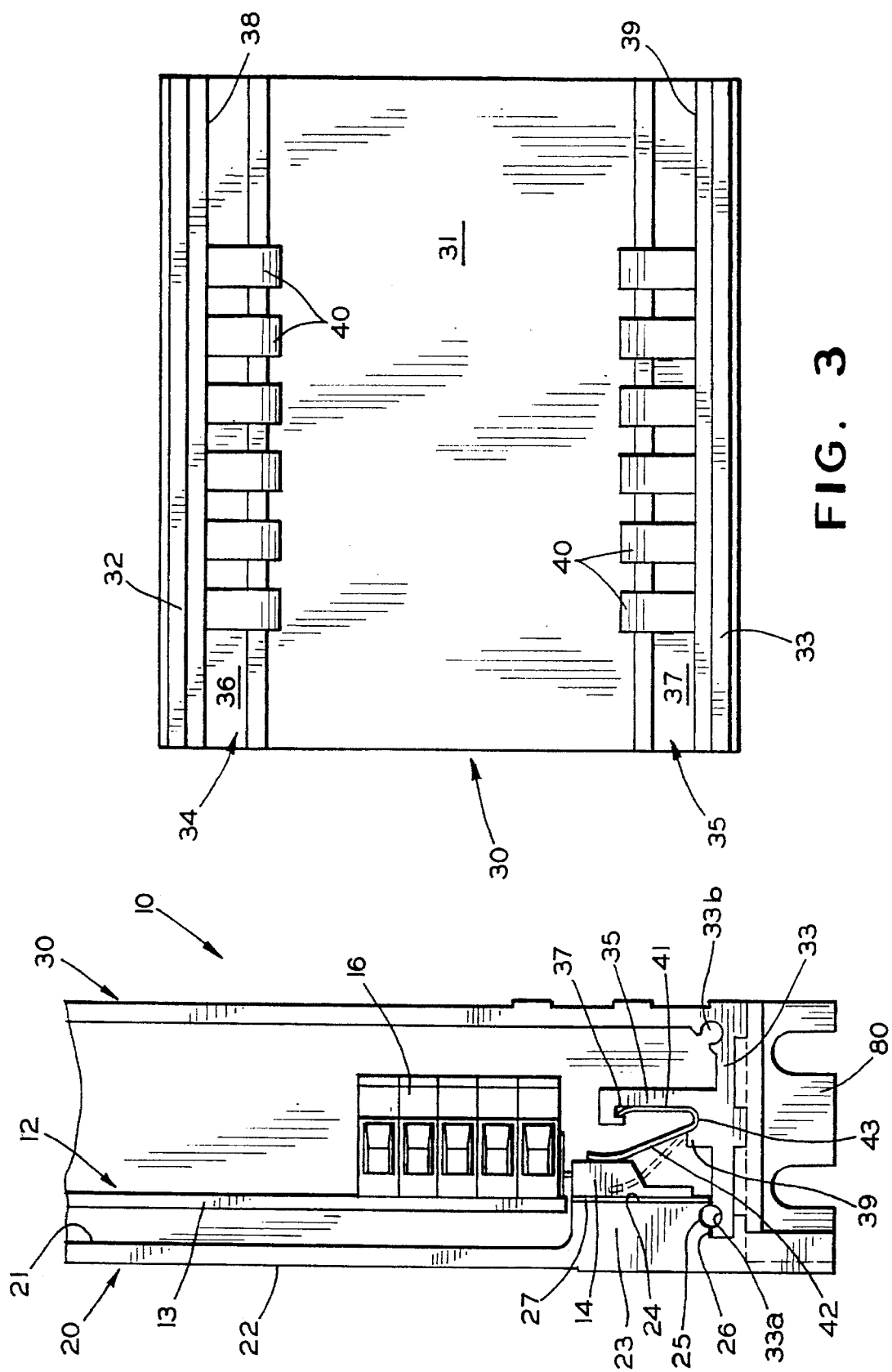

ENCLOSURE FOR AN ELECTRONIC CIRCUIT MODULE

BACKGROUND OF THE INVENTION

This invention relates in general to electronic circuit modules and in particular to an improved structure for an enclosure for such an electronic circuit module.

Electronic circuit modules are well known in the art and are typically composed of an enclosure which protectively houses one or more electrical components and associated electrical conductors. The enclosure is usually formed from a rigid metallic material. Typically, the electrical components and electrical conductors are mounted on one or more flat rigid printed circuit boards. The printed circuit boards are mounted within the protective enclosure to form the electronic circuit module.

As is well known in the art, when electric current flows through an electrical component, heat is generated therein. This heat, if not dissipated, can damage the electrical component. This is particularly true when the electrical component is housed within the protective enclosure of an electronic circuit module, where cooling air cannot flow freely thereabout. Thus, most known electronic circuit modules provide a heat sink to dissipate the heat generated by the electrical components contained within the enclosure. The heat sink is a relatively large mass of thermally conductive material, such as metal, which conducts heat away from the electrical component and the interior of the enclosure to a location where the heat may be dissipated into the air. As a result, the temperature of the electrical component is maintained within a predetermined operating range so as to prevent damage thereto.

To effectively perform this heat transferring function, the electrical component must be maintained in direct physical contact with a surface of the heat sink. To accomplish this, known electronic circuit modules have employed fixed devices, such as threaded fasteners, soldered straps, and the like, to mechanically secure the electrical components to the heat sink. Although these fixed devices have functioned satisfactorily in the past, it has been found that they were somewhat inconvenient to use with differing printed circuit boards. This is because the electrical components of a first printed circuit board were not located in the same positions as the electrical components mounted on a second printed circuit board. Because the locations of the fixed devices on the enclosure were not readily movable, it was difficult to accommodate the differing locations of the electrical components on differing printed circuit boards. As a result, known enclosures for electronic circuit modules have been relatively complicated and expensive to manufacture and assemble for use with differing printed circuit boards. Thus, it would be desirable to provide an improved structure for an enclosure for an electronic circuit module which can easily accommodate the differing locations of the electrical components on differing printed circuit boards.

Additionally, it has been found that these fixed devices tend to become loosened as a result of the repeated heating and cooling cycles experienced when the electrical component is turned on and off. Such loosening can reduce the direct physical contact between the electrical components and the heat sink and, consequently, adversely affect the ability of the heat sink to conduct heat away from the electrical components. Also, it has been found that the repeated heating and cooling can cause flexing of the printed circuit board and, as a result, undesirable stress on the electrical components. Thus, it would also be desirable to provide an improved structure for an enclosure for an electronic circuit module which provides an effective heat sink for the electronic components without generating undesirable mechanical stresses.

SUMMARY OF THE INVENTION

This invention relates to an improved structure for an enclosure adapted to protectively house a printed circuit board in an electronic circuit module. The enclosure includes a base having an internal surface and an external surface. The base includes a pair of raised mounting pads formed on the internal surface which define respective mounting surfaces. A pair of channels are also formed on the internal surface of the base. The enclosure further includes a cover having a panel portion and a pair of end wall portions. Respective projections are formed on each of the end wall portions which define grooves therein. The cover is assembled to the base by inserting the edges of the end wall portions provided on the cover into the channels provided on the base. A plurality of spring clips are disposed within each of the grooves provided on the cover. The spring clips can be positioned at any desired location along each of the grooves. When the cover is connected to the base, the spring clips urge electrical components mounted on the printed circuit board into abutment with the mounting pads provided on the base. As a result, a firm mechanical engagement is maintained between the electrical components and the mounting pads. The mounting pads conduct heat generated by the electrical components away therefrom for dissipation.

Various objects and advantages of this invention will become apparent to those skilled in the art from the following detailed description of the preferred embodiment, when read in light of the accompanying drawings.

BRIEF DESCRIPTION OF THE DRAWINGS

FIG. 2 is an enlarged side elevational view of the base, the cover, and the printed circuit board of the enclosure for the electronic circuit module illustrated in FIG. 1 shown assembled.

FIG. 3 is an enlarged elevational view of the internal side of the cover of the enclosure for the electronic circuit module illustrated in FIGS. 1 and 2.

DETAILED DESCRIPTION OF THE PREFERRED EMBODIMENT

Figure 1:
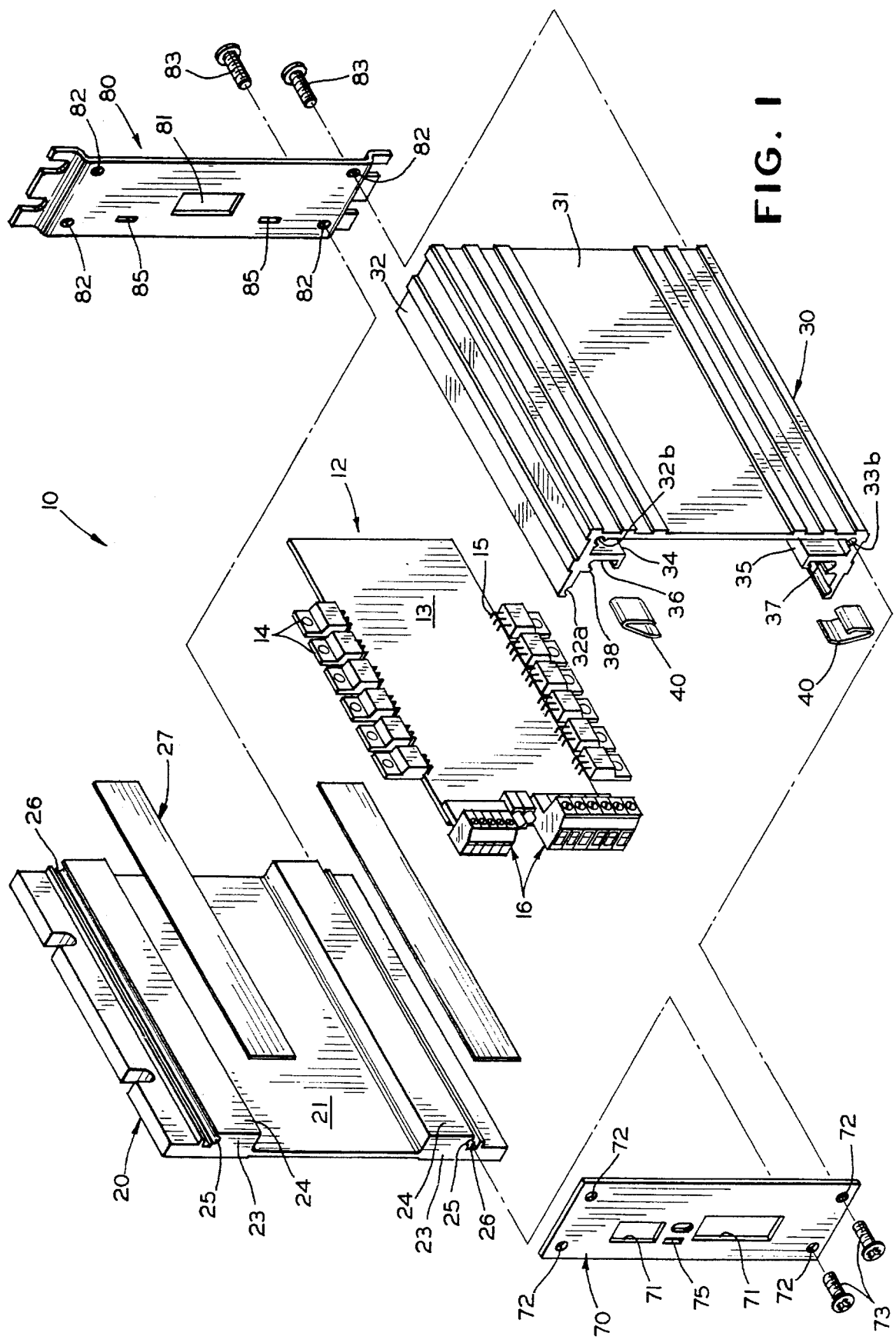
FIG. 1 is an exploded perspective view of an electronic circuit module including a printed circuit board and a protective enclosure in accordance with this invention.

Referring now to the drawings, there is illustrated an electronic circuit module, indicated generally at 10, in accordance with this invention. The electronic circuit module 10 includes a printed circuit board, indicated generally at 12, which is supported within a protective enclosure. The structure of the protective enclosure will be discussed in detail below. The printed circuit board 12 is conventional in the art and is intended to be representative of any known electrical apparatus which can be supported within the protective enclosure in the manner described below.

The illustrated printed circuit board 12 includes a flat rigid panel 13 upon which a plurality of electrical components 14 are mounted. The various electrical components 14 are electrically connected together by a plurality of electrical conductors (not shown) which are typically printed on one or both surfaces of the rigid panel 13. In the illustrated embodiment, the electrical components 14 are oriented so as to extend generally parallel with respect to the plane defined by the rigid panel 13 of the printed circuit board 12. Thus, the electrical components 14 extend beyond the longitudinal edges of the rigid panel 13, as shown in FIGS. 1 and 2.

Each of the electrical components 14 is supported on and electrically connected to the rigid panel 13 by one or more electrical leads 15. The illustrated electrical components 14 are mounted in two rows which extend along the opposed longitudinal edges of the rigid panel 13. Additional electrical components (not shown) may be mounted directly on the surface of the rigid panel 13. A plurality of conventional connector devices 16, such as the illustrated Phoenix-type connectors, can also be provided on the rigid panel 13 so as to permit the electrical components 14 to be electrically connected to other electrical devices (not shown) located outside of the electronic circuit module 10.

The enclosure of the electronic circuit module 10 includes a base, indicated generally at 20, defining an internal surface 21 and an external surface 22 (see FIG. 2). The illustrated base 20 is generally flat and rectangular, although it may be formed in any desired shape. A pair of raised mounting pads 23 are provided on the internal surface 21 of the base 20. The illustrated mounting pads 23 are preferably formed integrally with the base 20 and define respective elongated mounting surfaces 24. The mounting surfaces 24 preferably define planes which are parallel to the internal and external surfaces 21 and 22 of the base 20.

The mounting pads 23 preferably extend substantially parallel to one another throughout the entire length of the base 20 adjacent to the opposed longitudinal edges thereof. A semi-cylindrical recess 25 is formed on the outer surface of each of the mounting pads 23. As best shown in FIG. 2, the recesses 25 also extend longitudinally throughout the entire length of the base 20. A pair of raised elongated channels 26 are also provided on the internal surface 21 of the base 20. The channels 26 are located adjacent to the mounting pads 23 and extend generally parallel thereto. The purposes of the mounting pads 23, the semi-cylindrical recesses 25, and the channels 26 will be explained below. The entire base 20 is formed of a thermally conductive material, and is preferably formed as an integral, one-piece unit of black anodized extruded aluminum.

A layer 27 of a thermally conductive, electrically insulating material is provided on each of the mounting surfaces 24 on the base 20. Preferably, these layers 27 are embodied as flat strips of a silicon material respectively secured to the mounting surfaces 24 by any suitable means, such as by adhesive. The silicon strip layers 27 preferably extend along substantially the entire extent of each of the mounting surfaces 24. The purpose of these layers 27 will also be explained below.

The enclosure of the electronic circuit module 10 further includes a cover, indicated generally at 30. The cover 30 includes a panel portion 31 which is formed generally in the same shape as the base 20 described above. A first end wall portion 32 is formed integrally with the rectangular panel 31 and extends generally transversely from one edge thereof. Similarly, a second end wall portion 33 is formed integrally with the rectangular panel portion 31 and extends generally transversely from the opposite edge thereof. Thus, the first and second end wall portions 32 and 33 extend generally parallel to one another.

A longitudinally extending semi-cylindrical recess 32a is formed on the inner surface of the first end wall portion 32 adjacent to the longitudinal edge thereof. Similarly, a longitudinally extending semi-cylindrical recess 33a is formed on the inner surface of the second end wall portion 33 adjacent to the longitudinal edge thereof. The purposes of these recesses 32a and 33a will be explained below. Additionally, a longitudinally extending cylindrical recess 32b is formed on the inner surface of the first end wall portion 32 adjacent to the panel 31. Similarly, a longitudinally extending cylindrical recess 33b is formed on the inner surface of the second end wall portion 33 adjacent to the panel 31. The purposes of these recesses 32b and 33b will also be explained below.

Each of the first and second end wall portions 32 and 33 is formed having an elongated projection 34 and 35, respectively, extending therefrom. The projections 34 and 35 extend inwardly toward one another, generally parallel to the panel portion 31. Each of the projections 34 and 35 terminates in a generally U-shaped end portion. Elongated grooves 36 and 37, are thus respectively defined on each of the projections 34 and 35 between the end wall portions 32 and 33 and the associated U-shaped end portions. Additionally, each of the first and second end wall portions 32 and 33 is formed having first and second lips 38 and 39. The lips 38 and 39 are located adjacent the respective projections 34 and 35. The purposes of the projections 34 and 35, the grooves 36 and 37, and the lips 38 and 39 will be explained below. As with the base, the entire cover 30 is formed of a thermally conductive material, and is preferably formed as an integral one-piece unit of black anodized extruded aluminum.

A plurality of generally V-shaped spring clips, indicated generally at 40, are provided in the electronic circuit module 10. Each of the spring clips 40 is formed having a first leg portion 41 and a second leg portion 42 connected by a curved intermediate portion 43. The spring clips 40 are formed from a resilient material, preferably spring steel. Each of the spring clips 40 is adapted to be releasably retained in either of the grooves 36 and 37 provided on the projections 34 and 35 of the end wall portions 32 and 33 of the cover 30.

To accomplish this, the first leg portions 41 of the spring clips 40 are sized to be inserted axially within the grooves 36 and 37. When so inserted, the first leg portions 41 of the spring clips 40 lay flat against the grooves 36 and 37. The ends of the first leg portions 41 are captured within the U-shaped end portions of the projections 34 and 35, while the curved intermediate portions 43 are captured between the projections 34 and 35 and the associated lips 38 and 39. This is best shown in FIG. 2 with respect to the spring clip 40 retained in the groove 37 by the projection 35 and the lip 39 formed on the second end wall portion 33. Thus, the spring clips 40 are slidably retained within the grooves 36 and 37 provided on the projections 34 and 35.

The spring clips 40 can be installed by slightly compressing them manually and inserting them axially in the grooves 36 and 37 as described above. While slightly compressed, the spring clips 40 can be easily slid along the grooves 36 and 37 to any desired position relative thereto. When the desired position is attained, the slight compression of the spring clips 40 is released, allowing it to expand under the resilience of the curved intermediate portion 43 into frictional engagement with the projections 34 and 35 and the lips 38 and 39. Further axial movement of the spring clips 40 in the grooves 36 and 37 is thereby prevented. Thus, the spring clips 40 can be quickly and easily installed in the grooves 36 and 37. The number of such spring clips 40, as well as the specific positioning thereof on the cover 30, may be adjusted as desired.

To assemble the electronic circuit module 10, the spring clips 40 are initially installed within the grooves 36 and 37 on the cover 30 as described above. Preferably, the spring clips 40 are positioned in predetermined locations on the cover 30 by means of a template or gauge (not shown) so as to correspond to the positions of the electrical components 14 on the printed circuit board 12, as will become apparent below. As discussed above, once the spring clips 40 are properly positioned and the slight compression thereof is released, they frictionally engage the projections 34 and 35 and are maintained in such desired positions.

Next, the circuit board 12 is positioned relative to the base 20 so that each of the electrical components 14 engages and is supported on one of the silicon strips 27 provided on the mounting surfaces 24 of the mounting pads 23. As discussed above, the silicon strips 27 are effective to conduct heat from the electrical components 14 to the mounting pads 23, but also electrically isolate such electrical components 14 from the metallic mounting pads 23.

Following this, the cover 30 is connected to the base 20. To accomplish this, the longitudinal edges of the first and second end walls 32 and 33 of the cover 30 are inserted within the channels 26 formed on the internal surface 21 of the base 20, as shown in FIG. 2. The cooperation of the longitudinal edges of the first and second end walls 32 and 33 with the channels 26 not only accurately positions the cover 30 relative to the base, but also provides a direct mechanical connection which is effective for transferring heat therebetween, as will be described further below.

Referring to FIG. 2, it can be seen that when the cover 30 is connected to the base as described above, each of the spring clips 40 engages one of the electrical components 14, urging the electrical components 14 into firm abutment with the silicon strip layers 27 provided on the mounting surfaces 24 of the mounting pads 23. As a result, a reliable mechanical engagement is maintained between each of the electrical components 14 and the mounting pads 23. Thus, heat generated by the electrical components 14 during use can be transferred through the silicon strip layers 27 to the mounting pads 23 and the remainder of the base 20. Such heat can then be dissipated into the air surrounding the enclosure to maintain the temperature of the electrical components 14 within a predetermined operating range.

Also referring to FIG. 2, it can be seen that when the cover 30 is connected to the base 20 as described above, the semi-cylindrical recesses 25 formed in the mounting pads 23 of the base 20 are aligned with the semi-cylindrical recesses 32a and 33a respectively formed in the end walls 32 and 33 of the cover 30. This alignment effectively defines a pair of cylindrical apertures extending longitudinally throughout the assembly of the base 20 and the cover 30. The purpose of these cylindrical apertures will be explained below.

The sides of the enclosure are closed by first and second side plates 70 and 80, both of which are preferably formed of stamped cold rolled steel. The first side plate 70 is positioned over one of the open ends of the enclosure formed by the base 20 and the cover 30. The first end plate 70 has a pair of openings 71 formed therethrough through which the connection devices 16 can extend. The first side plate 70 also has a plurality of apertures 72 formed therethrough through which respective threaded fasteners 73 can extend.

When the first side plate 70 is assembled with the base 20 and the cover 30, a first one of the apertures 72 is axially aligned with the cylindrical aperture defined by the cooperating semi-cylindrical recesses 25 and 32a respectively provided in the mounting surface 23 and the first end wall portion 32. Similarly, a second one of the apertures 72 is axially aligned with the cylindrical aperture defined by the cooperating semi-cylindrical recesses 25 and 33a respectively provided in the mounting surface 23 and the second end wall portion 33. Thus, first and second threaded fasteners 73 can extend through such apertures 72 into cooperation with the cylindrical apertures to secure the first side plate 70 to the base 20 and the cover 30.

When the first side plate 70 is assembled with the base 20 and the cover 30, a third one of the apertures 72 is axially aligned with the cylindrical recess 32b formed on the inner surface of the first end wall portion 32 adjacent to the panel 31. Also, a fourth one of the apertures 72 is axially aligned with the cylindrical recess 33b formed on the inner surface of the second end wall portion 33 adjacent to the panel 31. Thus, third and fourth threaded fasteners 73 can extend through such apertures 72 into cooperation with the cylindrical recesses 32b and 33b to secure the first side plate 70 to the base 20 and the cover 30.

The second side plate 80 is similarly positioned over the other of the open ends of the enclosure formed by the base 20 and the cover 30. The second end plate 80 is also formed having one or more openings 81 through which other devices (not shown) can extend. The second side plate 80 also has a plurality of apertures 82 formed therethrough through which respective threaded fasteners 83 can extend into the various recesses described above to secure the second side plate 80 to the base 20 and the cover 30. If desired, the first and second side plates 70 and 80 may be formed having respective slots 75 and 85 which are adapted to receive a tab (not shown) extending longitudinally from the rigid panel 13 of the printed circuit board 12. The cooperation of these tabs with the slots 75 and 85 provides additional support for the printed circuit board 12 within the enclosure.

In accordance with the provisions of the patent statutes, the principle and mode of operation of this invention have been explained and illustrated in its preferred embodiment. However, it must be understood that this invention may be practiced otherwise than as specifically explained and illustrated without departing from its spirit or scope.

What is claimed is:

1. An electronic circuit module comprising:

a base including a surface;

a cover secured to said base, said cover including a surface having a groove formed therein;

a spring slidably mounted in said groove formed in said cover; and an electrical component disposed between said base and said cover, said spring urging said electrical component into engagement with said surface of said base.

2. The electronic circuit module defined in claim 1 wherein said base is formed from a thermally conductive material.

3. The electronic circuit module defined in claim 2 wherein said base is formed from aluminum.

4. The electronic circuit module defined in claim 1 wherein said cover is formed from a thermally conductive material.

5. The electronic circuit module defined in claim 4 wherein said base is formed from aluminum.

6. The electronic circuit module defined in claim 1 wherein said spring is a generally V-shaped spring clip.

7. The electronic circuit module defined in claim 1 wherein said spring is normally frictionally retained in said groove and is slidable throughout said groove upon flexing thereof.

8. The electronic circuit module defined in claim 1 further including a plurality of electrical components disposed between said base and said cover.

9. The electronic circuit module defined in claim 8 further including a plurality of springs slidably mounted in said groove, said springs urging said plurality of electrical components into engagement with said surface of said base.

10. The electronic circuit module defined in claim 1 wherein said cover includes a plurality of grooves formed therein, and wherein at least one spring is slidably mounted in each of said grooves.

11. The electronic circuit module defined in claim 1 further including a mounting pad projecting from said surface of said base generally toward said cover, and wherein said electrical component is urged into engagement with said mounting pad by said spring.

12. The electronic circuit module defined in claim 1 further including a layer of electrically insulating material disposed between said electrical component and said surface of said base.

13. The electronic circuit module defined in claim 12 wherein said layer of electrically insulating material is formed from silicon.

14. The electronic circuit module defined in claim 1 wherein said cover includes a generally flat panel having an end wall extending generally perpendicular thereto, said surface of said cover being located on said end wall.

15. The electronic circuit module defined in claim 14 wherein said end wall is a first end wall, and wherein said cover further includes a second end wall extending generally perpendicular to said panel.

16. The electronic circuit module defined in claim 15 wherein said groove is a first groove, and wherein a second groove is formed in said second end wall of said cover, a second spring being slidably mounted in said second groove for urging a second electrical component into engagement with said surface of said base.

17. The electronic circuit module defined in claim 16 wherein said base is formed having first and second surfaces, said first spring urging said first electrical component into engagement with said first surface of said base, said second spring urging said second electrical component into engagement with said second surface of said base.

18. The electronic circuit module defined in claim 1 further including a side plate secured to said base and said cover to form an enclosure.

19. The electronic circuit module defined in claim 1 further including first and second side plates secured to opposite ends of said base and said cover to form an enclosure.

* * * * *